US007416420B2

(12) United States Patent
Schmitt et al.

(10) Patent No.: US 7,416,420 B2
(45) Date of Patent: Aug. 26, 2008

(54) CONDUCTIVE ADHESIVE BOND

(75) Inventors: Hans-Michael Schmitt, Muennerstadt (DE); Oswald Reuss, Unterelsbach (DE); Annegret Suckfuell, Mittelstreu (DE); Klaus Hemmert, Hollstadt (DE)

(73) Assignee: Preh-Werke GmbH & Co. KG, Bad Neustadt A.D. Saale ( * ) Notice: Subject to any disclaimer, the term of this patent is extended or adjusted under 35 U.S.C. 154(b) by 0 days.

(21) Appl. No.: 10/438,914

(22) Filed: May 16, 2003

(65) Prior Publication Data

US 2003/0216080 A1 Nov. 20, 2003

(30) Foreign Application Priority Data

May 18, 2002 (DE) ................................ 102 22 265

(51) Int. Cl.
*H01R 12/00* (2006.01)
*H05K 1/00* (2006.01)

(52) U.S. Cl. ........................................ 439/83; 439/876

(58) Field of Classification Search ................... 439/83, 439/886, 876, 847
See application file for complete search history.

(56) References Cited

U.S. PATENT DOCUMENTS

| | | | | |
|---|---|---|---|---|
| 2,902,629 | A * | 9/1959 | Little et al. | 439/83 |
| 3,239,720 | A * | 3/1966 | Rayburn | 439/83 |
| 3,354,260 | A * | 11/1967 | Brandt et al. | 439/83 |
| 3,541,225 | A * | 11/1970 | Raciti | 439/83 |
| 4,575,167 | A * | 3/1986 | Minter | 439/83 |
| 6,152,782 | A * | 11/2000 | Volkert et al. | 439/733.1 |
| 6,179,631 | B1 * | 1/2001 | Downes et al. | 439/83 |
| 6,229,101 | B1 * | 5/2001 | Sekiya et al. | 439/83 |
| 2003/0199179 | A1 * | 10/2003 | Dozier et al. | 439/66 |

FOREIGN PATENT DOCUMENTS

| | | | |
|---|---|---|---|
| DE | 1 288 177 | A1 | 1/1969 |
| DE | 35 45 789 | A1 | 8/1986 |
| DE | 37 03 465 | A1 | 8/1988 |
| DE | 37 24 237 | A1 | 2/1989 |
| DE | 40 12 061 | A1 | 10/1991 |

* cited by examiner

*Primary Examiner*—Felix O. Figueroa
(74) *Attorney, Agent, or Firm*—Muncy, Geissler, Olds & Lowe PLLC

(57) ABSTRACT

Conductive adhesive bonds are used preferably where the contact bonds are subject to great temperature variations, for example, on a throttle valve controller. In order to increase the mechanical stabilization of the conductive adhesive bonds, the surface of the contacts are machined and provided with structures such as ribbing, prickles, etc. As a result of this structuring, the conductive adhesive interlocks mechanically at these points. This leads to a high contact reliability also at extreme temperature changes.

18 Claims, 2 Drawing Sheets

CONDUCTIVE ADHESIVE BOND

This nonprovisional application claims priority under 35 U.S.C. § 119(a) on German Patent Application No. 102 22 265.7 filed in Germany on May 18, 2002, which is herein incorporated by reference.

BACKGROUND OF THE INVENTION

1. Field of the Invention

The present invention relates to a conductive adhesive bond on metal contacts.

2. Description of the Background Art

Conductive adhesive bonds are used preferably where the contact bonds are subject to great temperature variations, for example, on a throttle valve controller.

DE 40 12 061 A1 discloses a conductive and adhesive paste, which can also be used as a conductive adhesive on metal contacts. DE 37 03 465 C2 discloses a use of the conductive adhesive in electrical switching devices.

Despite good contacting of the conductive adhesive, this bond can loosen.

DE 35 45 789 C2 describes a switching device, the movable contacts of which have wiping grooves on the surface, which run at an angle of 45° oblique to the center line of a contact bar. A turning-gliding wiping motion is thereby created during interaction with other elements.

DE 37 24 237 C2 discloses a contact terminal, which is additionally provided with ribs on a contact area that provides for good electrical contact between a contact area of a supporting part and a clamped object.

SUMMARY OF THE INVENTION

It is therefore an object of the present invention to provide for conductive adhesive bonds that are mechanically more stable.

The invention is based on the idea of increasing the mechanical stabilization of the conductive adhesive bonds by machining the surface of the contact areas and structuring these with structures such as ribbing, prickles, etc. As a result of the structuring, the conductive adhesive interlocks mechanically at these points. For example, these structures, which can also include barbs or thorns, provide for a projection that is formed on the surface of the metal contact in order to firmly secure the metal contact within the adhesive. Additionally, this has the added benefit that the surface area of the metal contact is increased, thereby providing for a greater area for the adhesive to adhere to. This leads to a high contact reliability also at extreme temperature changes.

This thus produced conductive adhesion ensures high functional reliability also at extreme temperatures and temperature changes and different thermal expansion coefficients of the work pieces to be bonded, although sufficient room for contact expansion is provided at high temperatures.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION OF THE PREFERRED EMBODIMENTS

Figure 1:
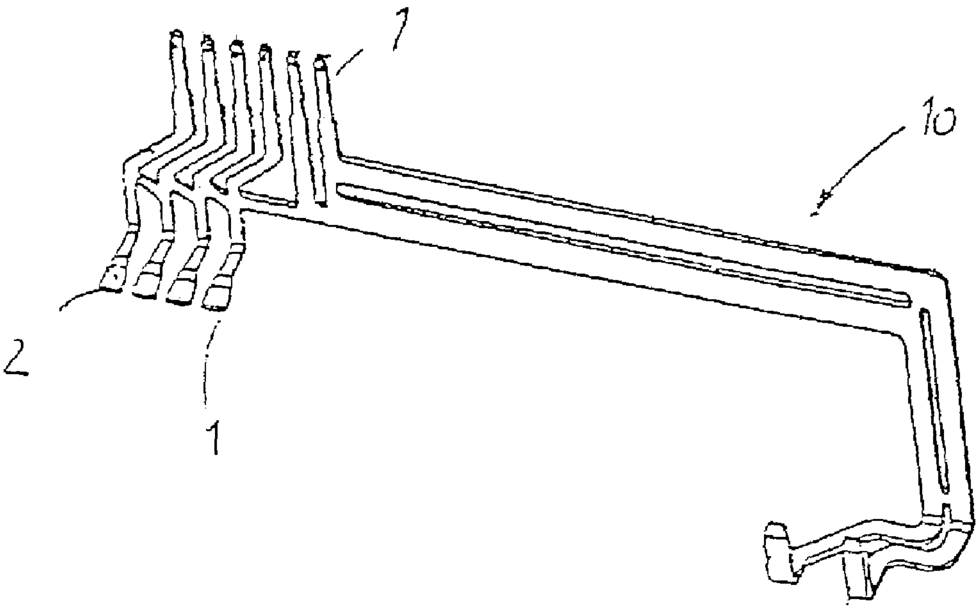
FIG. 1 is a schematic illustration of a double conductive bridge having metal contacts thereon.
Figure 2:
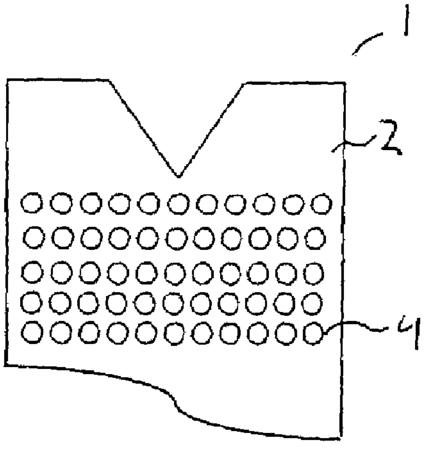
FIG. 2 is a schematic illustration of a surface of a metal contact.

FIG. 1 shows a conductive bridge 10 that can be embedded, for example, in plastic with several metal contacts 1. The surface 2 of the metal contacts 1 is structured for better contacting to a conductive adhesive 3 and has ribs or prickles 4, as shown in FIG. 2, whereby also other structures such as, for example, grooves are possible.

Figure 3:
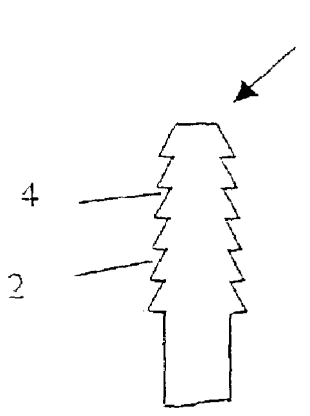
FIG. 3 is a lateral view of a metal contact according to a further embodiment of the present invention.

FIG. 3 shows one of the possible embodiments of the metal contact 1 in a side view. As can be seen from FIG. 3, the surface 2 of the metal contact 1 has prickles 4 formed thereon, which are shown here as symmetrical vertically displaced jagged protrusions. These prickles 4 increase the surface area of the metal contact so that a conductive adhesive has a greater adhesion area. Furthermore, because at least a portion of the prickles 4 are embedded in the contact adhesive, an interlocking adhesion between the metal contact 1 and the conductive adhesive is facilitated, to thereby prevent the metal contact 1 from being loosened from the conductive adhesive.

Figure 4:
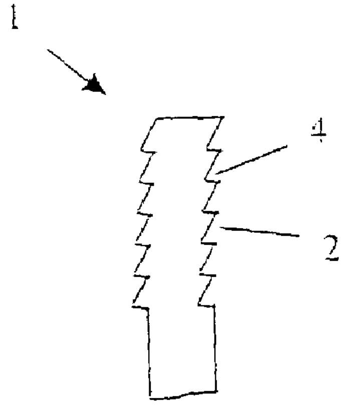
FIG. 4 is a lateral view of a metal contact according to a further embodiment of the present invention.

FIG. 4 shows another embodiment of the metal contact 1 in a side view, whereby here the prickles 4 form vertically displaced jagged protrusions, which are inverted on one side. Because the prickles 4 are inverted on one side, this has the added benefit that the metal contact 1 is firmly interlocked within the conductive adhesive such that the metal contact 1 is prevented from moving in either direction, e.g., further in or out from a preferred contact point.

Figure 5:
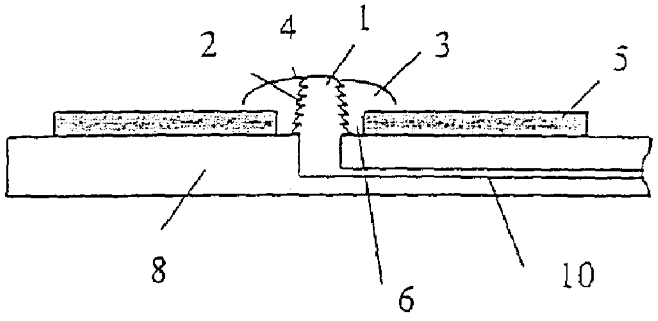
FIG. 5 is a schematic illustration of the contact between a metal contact and a sensor circuit board according to a preferred embodiment of the present invention.

FIG. 5 shows a sensor circuit board 5 attached to a plastic support 8 (not shown in greater detail), whereby the metal contact 1 penetrates through an opening 6 in the sensor circuit board 5. The sensor circuit board 5, which is to be contacted to the metal contacts 1, is contacted with the metal contacts 1 by conductive adhesive 3 (Ag conductive adhesive). The conductive adhesive 3 interlocks mechanically at these points through the ribs or prickles 4 of the contact surface much more rigidly than in the case of a smooth surface.

The basic material of the sensor circuit board 5 is a mineral-filled epoxy resin with contact sites produced by a screen printing technique through a polymeric silver conductive adhesive (polymer-Ag).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit board arrangement comprising:

a conductive connector having at least one mechanical contact area, the at least one mechanical contact area having integrated structures formed on a surface thereof, wherein a surface area of the integrated structures of the at least one mechanical contact area electrically connects to a second contact, wherein a conductive adhesive is mechanically interlocked with the at least one mechanical contact area along the surface area of the integrated structures for providing greater adhesion to the at least one mechanical contact area, wherein the integrated structures include a plurality of jagged protrusions which are provided on a first side of the at least one mechanical contact area and on a second side of the at least one mechanical contact area, wherein the jagged protrusions on the first side of the at least one mechanical contact area are inverted with respect to the jagged protrusions on the second side of the at least one mechanical contact area, wherein the jagged protrusions on the first side of the at least one mechanical contact area are directly opposite the jagged protrusions on the second side of the at least one mechanical contact area with respect to a longitudinal axis of the at least one mechanical contact area of the conductive connector, and wherein there are at least three jagged protrusions provided on each of the first side and the second side, a substrate; and a circuit board formed over the substrate, wherein the second contact is formed on the circuit board, wherein a body of the conductive connector is embedded in or attached to the substrate and extends along a main plane of the substrate, wherein the at least one mechanical contact area of the conductive connector extends through the circuit board in a direction perpendicular to the main plane of the substrate, and wherein the conductive adhesive electrically connects the surface area of the integrated structures of the at least one mechanical contact area to the second contact on a surface of the circuit board opposite the substrate.

2. The conductive connector according to claim 1, wherein the mechanical contact area further includes a ribbing.

3. The conductive connector according to claim 1, wherein the mechanical contact area further includes a prickle.

4. The conductive connector according to claim 1, wherein the mechanical contact area further includes grooves.

5. The conductive connector according to claim 1, wherein the conductive adhesive is a polymeric conductive adhesive.

6. The conductive connector according to claim 5, wherein the conductive adhesive is a polymeric silver conductive adhesive.

7. The conductive connector according to claim 1, wherein the mechanical contact area contacts at least one contact with a sensor circuit board.

8. The conductive connector according to claim 1, wherein the integrated structures are formed on the entire surface of the first and second side of the mechanical contact area.

9. The conductive connector according to claim 1, wherein the first side is directly opposite the second side with respect to a longitudinal axis.

10. The conductive connector according to claim 1, wherein the jagged protrusions on the first side are equal in number to the jagged protrusions on the second side.

11. The conductive connector according to claim 1, wherein the conductive adhesive contacts substantially all of the surface area of the integrated structures of the at least one mechanical contact area, thereby providing greater adhesion to the at least one mechanical contact area.

12. A circuit board arrangement comprising:

a metal contact having protruding structures formed on a first side of the metal contact and on a second side of the metal contact, wherein surface areas of the protruding structures of the metal contact are interlocked within a conductive adhesive, wherein the conductive adhesive electrically connects the surface areas of the protruding structures of the metal contact and a conductor, wherein at least a portion of the protruding structures are embedded in the conductive adhesive, wherein the protruding structures on the first side of the metal contact are inverted with respect to the protruding structures on the second side of the metal contact, wherein the protruding structures on the first side of the metal contact are directly opposite the protruding structures on the second side of the metal contact with respect to a longitudinal axis of the metal contact, and wherein there are at least three protruding structures on each of the first side and the second side, a substrate; and a circuit board formed over the substrate, wherein the conductor is formed on the circuit board, wherein a body of the metal contact is embedded in or attached to the substrate and extends along a main plane of the substrate, wherein a portion of the metal contact having the protruding structures extends through the circuit board in a direction perpendicular to the main plane of the substrate, and wherein the conductive adhesive electrically connects the surface area of the protruding structures of the metal contact to the conductor on a surface of the circuit board opposite the substrate.

13. The metal contact according to claim 12, wherein the metal contact extends from a conductive bridge.

14. The metal contact according to claim 12, wherein the conductive adhesive contacts substantially all of the surface areas of the protruding structures of the metal contact, thereby providing greater adhesion to the metal contact.

15. A circuit board arrangement comprising:

a conductive bridge comprising:

at least one metal contact extending from the conductive bridge, wherein the at least one metal contact electrically connects the conductive bridge and a conductor, the metal contact having structures formed thereon, wherein at least a portion of the structures formed on the metal contact are embedded in a conductive adhesive such that adhesion areas of the structures of the metal contact are interlocked within the conductive adhesive, wherein the conductive adhesive electrically connects the metal contact and the conductor, wherein the structures include at least three jagged protrusions which are provided on each of a first side of the metal contact and on a second side of the metal contact, wherein the jagged protrusions on the first side of the metal contact are inverted with respect to the jagged protrusions on the second side of the metal contact, and wherein the jagged protrusions on the first side of the metal contact are directly opposite the jagged protrusions on the second side of the metal contact with respect to a longitudinal axis of the metal contact, a substrate; and a circuit board formed over the substrate, wherein the conductor is formed on the circuit board, wherein a body of the conductive bridge is embedded in or attached to the substrate and extends along a main plane of the substrate, wherein the conductive bridge extends through the circuit board in a direction perpendicular to the main plane of the substrate, and wherein the conductive adhesive electrically connects the adhesion areas of the structures of the metal contact to the conductor on a surface of the circuit board opposite the substrate.

16. The conductive bridge according to claim 15, wherein the conductive adhesive contacts substantially all of the adhesion areas of the structures of the metal contact, thereby providing greater adhesion to the at least one mechanical contact area.

17. A circuit board arrangement comprising:

a conductive connector having a contact area that electrically connects to a second contact, the conductive connector comprising:

a plurality of barbs being provided on a first side of the contact area and on a second side of the contact area, each of the barbs having a first face being substantially perpendicular to a longitudinal axis of the conductive connector and a second face being inclined to the longitudinal axis, wherein the plurality of barbs on the first side of the contact area are inverted with respect to the plurality of barbs on the second side of the contact area, wherein the plurality of barbs on the first side of the contact area are directly opposite the plurality of barbs on the second side of the contact area with respect to the longitudinal axis, wherein the second faces of the barbs on the first side of the contact area are parallel to the second faces of the barbs on the second side of the contact area, wherein at least three barbs are provided on each of the first side and the second side of the contact area, and wherein the plurality of barbs on the first side of the contact area and the plurality of barbs on the second side of the contact area are embedded in a conductive adhesive such that the plurality of barbs on the first side of the contact area and the plurality of barbs on the second side of the contact area are interlocked within the conductive adhesive, a substrate; and a circuit board formed over the substrate, wherein the second contact is formed on the circuit board, wherein a body of the conductive connector is embedded in or attached to the substrate and extends along a main plane of the substrate, wherein the conductive connector extends through the circuit board in a direction perpendicular to the main plane of the substrate, and wherein the conductive adhesive electrically connects surface areas of the plurality of barbs on the first side of the contact area and the plurality of barbs on the second side of the contact area to the second contact on a surface of the circuit board opposite the substrate.

18. The conductive connector according to claim 17, wherein the conductive adhesive contacts substantially all surfaces areas of the plurality of barbs on the first side of the contact area and the plurality of barbs on the second side of the contact area, thereby providing greater adhesion to the at least one mechanical contact area.

* * * * *